United States Patent
Chen et al.

[11] Patent Number: 5,867,430
[45] Date of Patent: Feb. 2, 1999

[54] BANK ARCHITECTURE FOR A NON-VOLATILE MEMORY ENABLING SIMULTANEOUS READING AND WRITING

[76] Inventors: Johnny C. Chen, 11537 Silver Spring Ct., Cupertino, Calif. 95014; Chung K. Chang, 3450 Warburton Ave. , #10, Santa Clara, Calif. 95051; Tiao-Hua Kuo, 6843 Chiala La., San Jose, Calif. 95129; Takao Akaogi, 7911 October Way, Cupertino, Calif. 95014

[21] Appl. No.: 772,131

[22] Filed: Dec. 20, 1996

[51] Int. Cl.$^6$ ............... G06F 12/00; G11C 7/00
[52] U.S. Cl. ............... 365/189.04; 365/185.11; 365/189.09; 365/185.33; 327/530
[58] Field of Search ............ 365/185.11, 189.04, 365/230.03, 230.04; 711/103

[56] References Cited

U.S. PATENT DOCUMENTS

| | | | |
|---|---|---|---|
| 4,752,871 | 6/1988 | Sparks et al. | 364/200 |
| 5,007,022 | 4/1991 | Leigh | 365/189.04 |
| 5,241,510 | 8/1993 | Kobayashi et al. | 365/230.03 |
| 5,245,572 | 9/1993 | Kosonocky et al. | 365/185.11 |
| 5,276,642 | 1/1994 | Lee | 365/189.04 |
| 5,355,334 | 10/1994 | Koga et al. | 365/189.01 |
| 5,361,343 | 11/1994 | Kosonocky et al. | 365/185.11 |
| 5,506,810 | 4/1996 | Runas | 365/230.03 |
| 5,684,752 | 11/1997 | Mills et al. | 365/230.03 |
| 5,691,955 | 11/1997 | Yamauchi | 365/233 |

FOREIGN PATENT DOCUMENTS

| | | |
|---|---|---|
| 0 212 451 | 4/1987 | European Pat. Off. . |
| 0 372 873 | 6/1990 | European Pat. Off. . |
| 0 376 285 | 7/1990 | European Pat. Off. . |
| 0 745 995 | 4/1996 | European Pat. Off. . |
| 2 719 39 | 5/1994 | France . |
| 61-246997 | 11/1986 | Japan . |
| 63-086197 | 4/1988 | Japan . |
| 63-161599 | 7/1988 | Japan . |
| 5-54682 | 3/1993 | Japan . |
| 7-281952 | 10/1995 | Japan . |

OTHER PUBLICATIONS

Atmel, 4 Megabit 2.7–volt Battery–Voltage™ Flash with 256 K EEPROM CMOS Combination Memory–AT29BV432 AWAKE™ Memory Architecture.

Atmel, 4 Megabit 5–volt Flash with 256K E$^2$PROM Memory–AT29C432 ConcurrentFlash ™

*Primary Examiner*—David L. Robertson
*Attorney, Agent, or Firm*—Fliesler, Dubb, Meyer & Lovejoy, LLP

[57] ABSTRACT

A flash memory device is divided into two or more banks. Each bank includes a number of sectors. Each sector includes flash memory cells. Each bank has a decoder that selectively receives an address from an input address buffer or from an internal address sequencer controlled by an internal state machine. The output data for each bank can be communicated to a read sense amplifier or a verify sense amplifier. The read sense amplifier connects to the output buffer while the verify sense amplifier connects to the state machine. When one bank receives a write command, the internal state machine takes control and starts the program or erase operation. While one bank is busy with a program or erase operation, the other bank can be accessed for a read operation. Power is supplied for each of the read and write operations via an internal multiplexed multi power supply source that provides an amount of power needed based on the memory operation being performed.

28 Claims, 7 Drawing Sheets

BANK ARCHITECTURE FOR A NON-VOLATILE MEMORY ENABLING SIMULTANEOUS READING AND WRITING

BACKGROUND OF THE INVENTION

1. Field of the Invention

The present invention is directed to the field of nonvolatile memories. More particularly, this invention relates to a nonvolatile memory array with an arrangement that enables simultaneous read and write operations.

2. Description of the Related Art

Electronic systems typically include processors and memory. The memory will be used to store instructions and/or data. In some systems, non-volatile memory is needed to guarantee that the data is continuously stored even when the system is turned off. One non-volatile memory that is widely used is an EPROM. However, conventional EPROMs cannot be reprogrammed in the field. Thus, many electronic designs use EEPROMS, flash memories or battery-backed SRAM, all of which can be reprogrammed electrically. For devices where costs is a factor, flash memories are preferred because they are less expensive than EEPROMs and battery-backed SRAMs.

One problem with prior flash memories is that they do not provide sufficient random access. For example, prior flash memory devices typically do not allow a processor to perform a read operation while a program or erase operation is underway in the flash memory device. Typically, the processor periodically polls a status register of the flash memory device to detect the end of the program or erase operation before initiating a read operation to the flash memory device.

Unfortunately, the programming and erase cycle times for typical flash memory devices are orders of magnitude greater than acceptable read access times of a random access main memory. Such long latencies associated with programming or erase operations can lock up the operating system and prevent the system from functioning for unacceptably long time intervals if the flash memory is the only memory in the electronic system. Some prior flash memories allow erase suspend operations in order to address this problem. However, such memories typically impose a suspend latency interval of several microseconds before a read operation can be initiated.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high cost because multiple flash memory devices are implemented even though the capacity of a single flash memory device may accommodate the particular electronic device.

Another prior art system uses a flash memory in combination with an EEPROM memory. This system allows a read operation of one of the memories while writing to the other. The size of an EEPROM cell is significantly larger than that of a flash memory. Therefore, a device which uses an EEPROM rather than a flash memory will be more expensive. Additionally, because the device includes two different technologies, the device is more complex which results in higher design and manufacturing costs.

Thus, there is a need for an efficient flash memory device that allows simultaneous read and write operations.

SUMMARY OF THE INVENTION

The present invention, roughly described, provides for a non-volatile memory device that allows for simultaneous read and write operations.

In one embodiment, a memory device is divided into two or more banks. Each bank includes a number of sectors. Each sector includes a set of memory cells. Each bank has a decoder that selectively receives an address from an input address buffer or from an internal address sequencer controlled by an internal state machine. The output data for each bank can be communicated to a read sense amplifier or a verify sense amplifier. The read sense amplifier connects to the output buffer while the verify sense amplifier connects to the state machine. When one bank receives a write command (program or erase), the internal state machine takes control and starts the program or erase operation. While one bank is busy with the program or erase operation, the other bank can be accessed for reading data.

The present invention can be characterized as a semiconductor nonvolatile memory device comprising a first bank of sectors and a second bank of sectors, where each sector includes an array of flash memory cells. The memory device includes address logic having a first set of decoded lines and a second set of decoded lines as outputs. The address logic selectively using either a first address or a second address to access the first bank using the first set of decoded lines and selectively using the first address or the second address to access the second bank using the second set of decoded lines. In one embodiment, the memory device receives an address input and includes a state machine performing the embedded methods of erasing and programming.

One method for using the current invention includes simultaneously reading and writing in a semiconductor non-volatile memory device. The memory device includes a first set of memory cells and a second set of memory cells. The method includes writing to either the first set of memory cells or the second set of memory cells. A write address is sent to a first decoder if data is being written to the first set of memory cells. The write address is sent to a second decoder if the data is being written to the second set of memory cells. Data is read from the second set of memory cells, after the writing step has started, if the step of writing includes writing to the first set of memory cells. Data is read from the first set of memory cells, after the step of writing has started, if the step of writing includes writing to the second set of memory cells.

These and other objects and advantages of the invention will appear more clearly from the following detailed description in which the preferred embodiment of the invention has been set forth in conjunction with the drawings.

DETAILED DESCRIPTION

Figure 1:
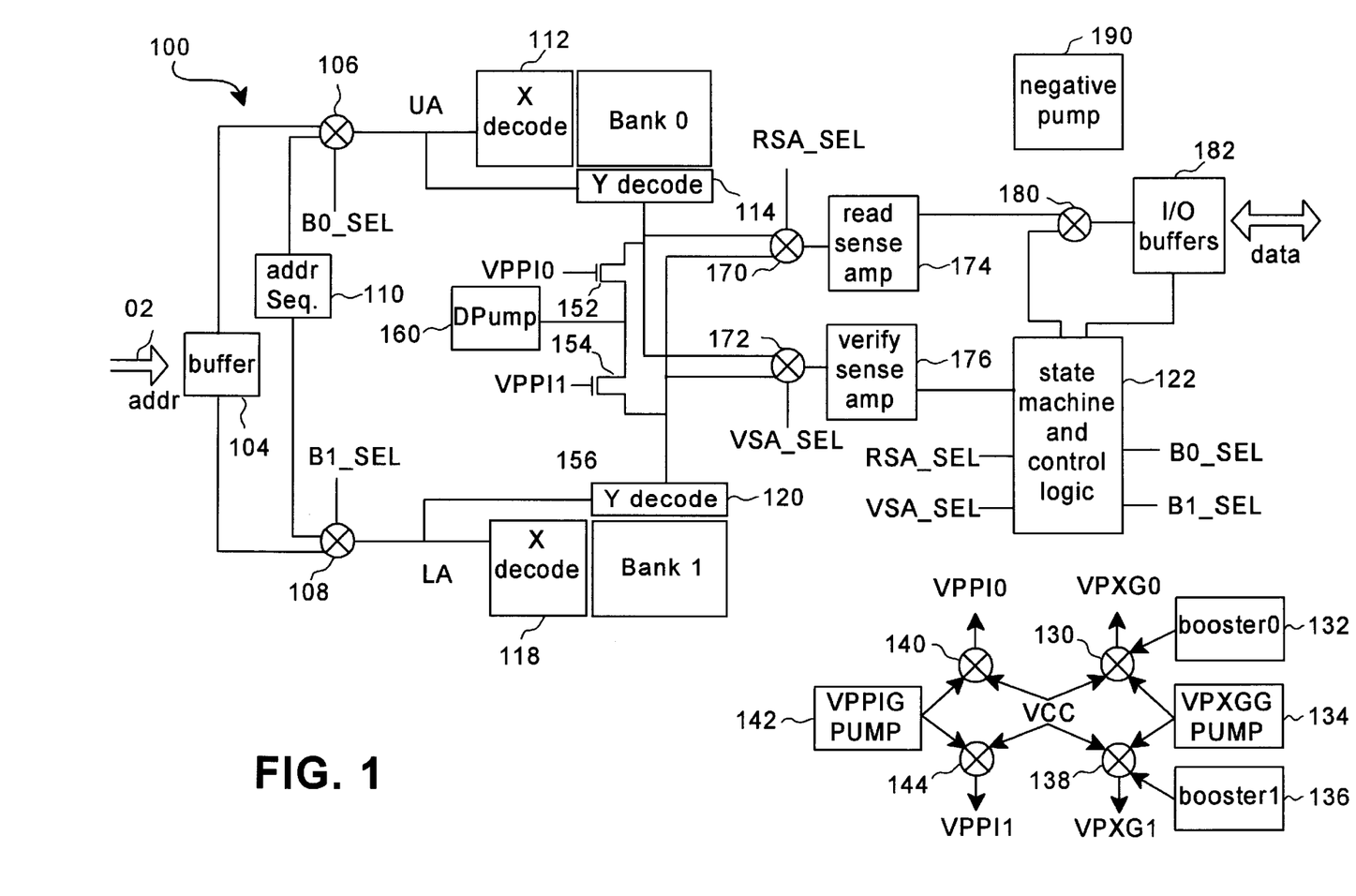
FIG. 1 is a block diagram of a memory device according to the present invention.

FIG. 1 illustrates a non-volatile memory device 100 that enables simultaneous read and write operations. Memory device 100 includes a 19 bit address input 102, an 8 bit data input/output (DATA), power inputs (not shown in FIG. 1) and control inputs (not shown in FIG. 1). The control inputs include Chip Enable, Output Enable, and Write Enable. The Chip Enable signal activates the chip's control logic and input buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip.

Address input 102 is received by buffer 104, which sends the address to multiplexer 106 and multiplexer 108. Memory device 100 includes an address sequencer 110 which is controlled by state machine and control logic 122. In one embodiment, the address sequencer is part of state machine and control logic 122. The output of address sequencer 110 is an address which is sent to both multiplexer 106 and multiplexer 108. Address sequencer 110 is used to generate sequential addresses during an erase sequence. The output of multiplexer 106, upper address UA, is communicated to X decode 112 and Y decode 114. The output of multiplexer 108, lower address LA, is sent to X decode 118 and Y decode 120. Multiplexer 106 chooses between the address from buffer 104 and the address from the address sequencer 110 in response to control signal B0_SEL. Multiplexer 108 chooses between the address from address buffer 104 and the address from address sequencer 110 based on the selection signal B1_SEL. The selection signals B0_SEL and B1_SEL are generated by state machine and control logic 122.

Bank 0 and Bank 1 are arrays (or sets) of flash memory cells. However, other non-volatile memories are also within the scope of the present invention. The address decode logic for Bank 0 includes X decode 112 and Y decode 114. X decode 112 includes a word line decoder and sector decoder. The word line decoder receives address bits UA[6:14] and the sector decoder receives address bits UA[15:18]. Y decode 114 includes a bit line decoder and Y gating. The bit line decoder receives address bits UA[0:5].

The address decode logic for Bank 1 includes X decode 118 and Y decode 120. X decode 118 includes a word line decoder and a sector decoder. The word decoder receives address bits LA[6:14] and the sector decoder receives address bits LA[15:18]. Y decode 120 includes a bit line decoder and Y gating. The bit line decoder receives address bits LA[0:5]. In one embodiment, buffer 102 includes a latch to store the address being decoded. In another embodiment, the latch can be part of the decoders.

FIG. 1 shows multiplexer 130 with three inputs: booster 0 132, VPXGG pump 134 and VCC. VPXGG pump 134 is a positive power supply for generating and supplying a regulated positive potential to the control gate of selected flash memory cells via word lines. Many different voltage pumps known in the art are suitable for use in the present invention. A more detailed explanation of one technology which can be included in VPXGG pump 134 can be found in U.S. Pat. No. 5,291,446, VPP Power Supply Having A Regulator Circuit For Controlling A Regulated Positive Potential, incorporated herein by reference. Booster 0 132 is used to boost the word line during reads. Multiplexer 130 receives a selection signal from state machine and control logic 122 and chooses one of its three inputs to send to the word lines of Bank 0 via X decode 112. The output of multiplexer 130 is labeled as VPXG0. FIG. 1 is drawn to show the three inputs 132, 134 and VCC connected to a multiplexer in order to simplify the disclosure. A more detailed description of one exemplar implementation can be found in U.S. patent application Ser. No. 08/560,459, A Fast 3-State Booster Circuit, filed Nov. 17, 1995, incorporated herein by reference. Many booster circuits and selection circuits known in the art are suitable for use in the present invention.

FIG. 1 also includes multiplexer 138 having three inputs: booster1 136, VPXGG pump 134 and VCC. Booster1 136 is similar to booster0 132. Multiplexer 138 operates similar to multiplexer 130, and receives its selection signal from state machine and control logic 122. The output of multiplexer 138 is VPXG1 which is sent to the word lines of Bank 1 via X decode 118. The purpose of multiplexers 130 and 138 is to switch between the three power lines depending on the operation being performed on the particular bank of memory cells.

VPPIG pump 142 is a high voltage pump used to pass high voltage to the drain of the memory cells. The output of VPPIG pump 142 is sent to multiplexer 140 and multiplexer 144. Both multiplexers also have VCC as an input. Multiplexers 140 and 144 switch between inputs based on signals from state machine and control logic 122. The output of multiplexer 140 is VPPI0 and the output of multiplexer 144 is VPPI1. During normal read operation, VPPI1 and VPPI0 are connected to VCC. VPPI0 is connected to the gate of N-channel transistor 152. VPPI1 is connected to the gate of N-channel transistor 154. The source of transistor 152 is connected to Y decode 114, multiplexer 170 and multiplexer 172. The drain of transistor 152 is connected to Dpump 160 and the drain of transistor 154. Dpump 160 is a drain power supply. Various drain power supplies known in the art can be used for the present invention. One exemplar drain pump is disclosed in U.S. Pat. No. 5,263,000, Drain Power Supply, Van Buskirk, et al., incorporated herein by reference. The source of transistor 154 is connected to multiplexer 170 and multiplexer 172. The source of transistor 154 is also connected to Y decode 120 for purposes of accessing the bit lines in Bank 1. The connections to multiplexers 170 and 172 provide a path for reading data from Bank 0 and Bank 1. Multiplexer 170 uses the signal RSA_SEL from state machine and control logic 122 to selectively choose one of the two input signals to communicate to read sense amplifier 174. Multiplexer 172 uses the selection signal VSA_SEL from state machine and control logic 122 in order to selectively communicate one of its two input signals to verify sense amplifier 176. Thus, the two transistors (152 and 154) and the two multiplexers (170 and 172), are used to selectively pass voltages to the drains of selected cells in Bank 0 or Bank 1 and to selectively read data from either Bank 0 or Bank 1.

Data from either Bank 0 or Bank 1 can be communicated to either read sense amplifier 174 or verify sense amplifier 176. Both sense amplifiers are in communication with state machine and control logic 122. While data from Bank 0 is communicated to read sense amplifier 174, data from Bank 1 can be communicated to verify sense amplifier 176. While data from Bank 0 is communicated to verify sense amplifier 176, data from Bank 1 can be communicated to read sense amplifier 174. The output of verify sense amplifier 176 is sent to state machine and control logic 122, which is used to verify that a particular byte has been programmed or erased.

Data from read sense amplifier 174 is sent to multiplexer 180. A second input of multiplexer 180 includes status information from state machine and control logic 122. The selection signal for multiplexer 180 is provided by state machine and control logic 122.

I/O buffers 182 are used to pass data out and receive data into memory device 100. While a read is being performed on one of the banks, multiplexer 180 will communicate output from read sense amplifier 174 to I/O buffers 182. During an erase or program sequence, multiplexer 180 will communicate status information to I/O buffers 182 so that an outside processor can poll memory device 100 for the status in regard to the erase or program.

Memory device 100 also includes negative pump 190, which is used to generate a relatively high negative voltage to control gates of selected memory cells via word lines of either Bank 0 or Bank 1, as selected by state machine and control logic 122. Thus, negative pump 190 is in communication with the X decoders. One example of a negative pump can be found in U.S. patent application Ser. No. 08/559,705, Low Supply Voltage Negative Charge Pump, filed Feb. 15, 1996, incorporated herein by reference.

State machine and control logic 122 provide the control for read, program and erase operations. Many of the selection lines used to select between Bank 0 and Bank 1 are controlled by state machine and control logic 122. Alternatively, the output from the sector decoders can be used to select between banks of memory cells.

Memory device 100 is programmed using an embedded programming sequence and is erased using an embedded erase sequence. The embedded sequences allow a processor to initiate a program or erase sequence and perform other tasks while the program and erase sequence are being carried out. The embedded program and erase sequences are controlled by state machine and control logic 122, which uses a command register to manage the commencing of either sequence. The erase and programming operations are only accessed via the command register, which controls an internal state machine that manages device operations. Commands are written to the command register via the data input to memory device 100.

While one bank is being programmed, the other bank can be accessed for a read operation. For example, during a program of a byte in Bank 1, state machine and control logic 122 would cause multiplexer 108 to select the address from buffer 104 for communication to decoders 118 and 120. The output of Bank 1 would be sent to verify sense amplifier 176 via multiplexer 172. During a read operation to Bank 0, state machine and control logic 122 instructs multiplexer 106 to select the address from buffer 104 for communication to decoders 112 and 114. The output of Bank 0 would be sent to read sense amplifier 174 via multiplexer 170. The output of read sense amplifier 174 would be sent, via multiplexer 180, to I/O buffers 182.

Similarly, during an erase of a sector in Bank 0, state machine and control logic 122 would cause multiplexer 106 to select addresses from address sequencer 110. Address sequencer 110 would be used to cycle through all the bytes in a particular sector to make sure that each byte is preprogrammed. The sector is subsequently bulk erased. After erasure, address sequencer would be used to generate addresses to verify each byte of this erase sector. While Bank 0 is being erased and multiplexer 106 is selecting an address from address sequencer 110, a read can be carried out in Bank 1 by using multiplexer 108 to select the address from buffer 104 rather than an address from address sequencer 110. During the verify operation of the erase method for Bank 0, state machine and control logic 122 would be verifying the data using verify sense amplifier 172, while read data from Bank 1 would be communicated to read sense amplifier 174. Thus, each bank has two input address paths and two output data paths that can be multiplexed so that either bank can be read from while the other bank is simultaneously being written to.

Figure 2:
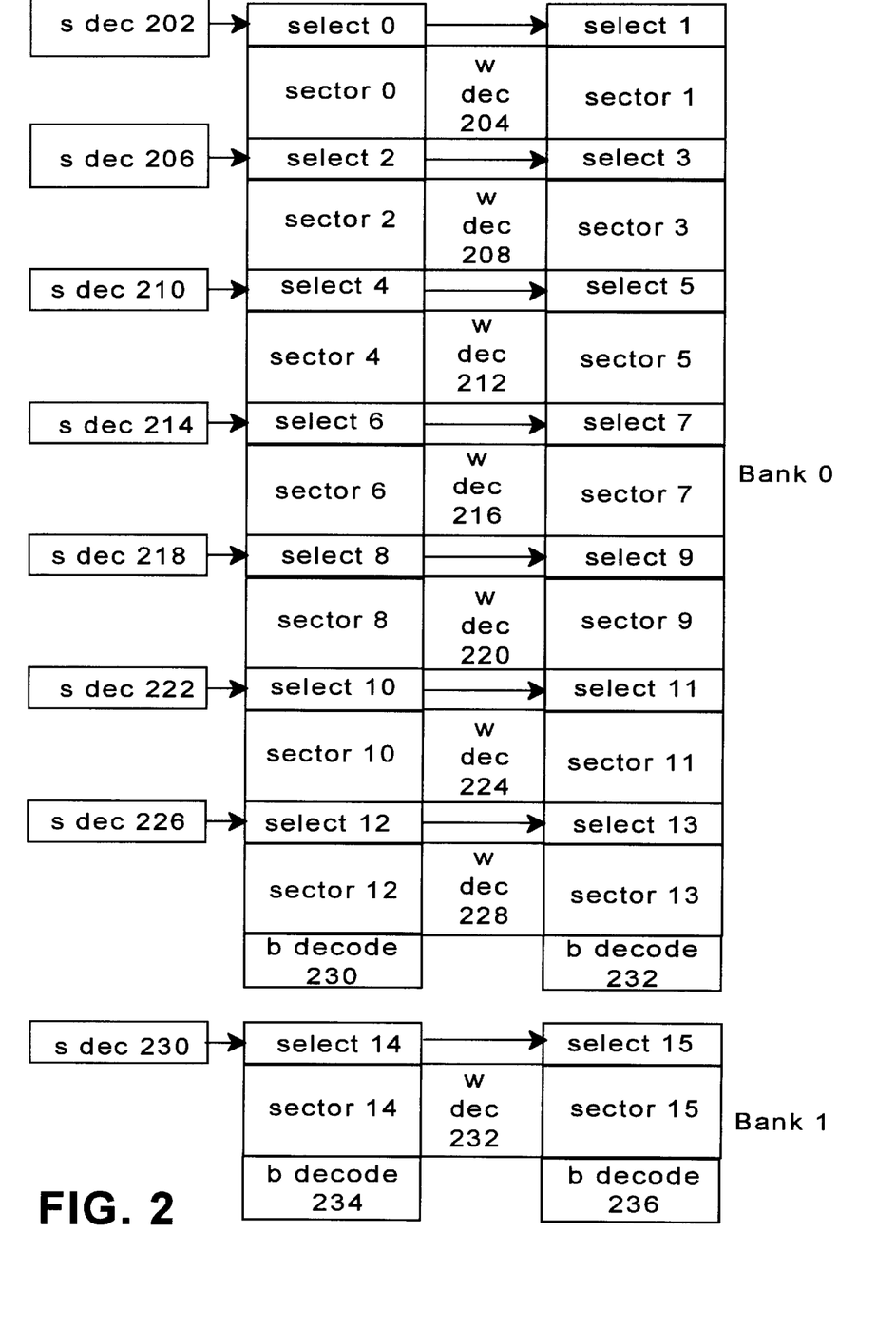
FIG. 2 is a more detailed block diagram of Bank 0, Bank 1 and the decoders depicted in FIG. 1.

FIG. 2 shows Bank 0, Bank 1 and the associated decoders in more detail. Bank 0 includes 14 sectors (sector 0–sector 13), each sector having 64K bytes. The sectors are grouped in pairs. Each pair shares a word line decoder and a sector decoder. All the even sectors of Bank 0 share bit line decoder 230 and all the odd banks share bit line decoder 232. For example, sector 0 and sector 1 share sector decoder 202 and word line decoder 204. Sector decoder 202 receives address bits A15, A16, A17 and A18. If, based on those four signals, sector decoder 202 determines that the address being accessed is in sector 0, sector decoder 202 sends a sector enable signal to select sector 0 logic (select 0), which enables the word line decoder 204 and bit line decoder 230 to access a particular byte in sector 0. Similarly, if sector decode logic 202 determines that addresses A15, A16, A17 and A18 are accessing a byte in sector 1, sector decoder 202 sends a sector enable signal to select sector 1 logic (select 1) which enables word line decoder 204 and bit line decoder 232 to access a byte in sector 1.

Sector 2 and sector 3 share sector decoder 206 and word line decoder 208. Sector decoder 206 receives address bits A15, A16, A17 and A18. If, based on those four signals, sector decoder 206 determines that the address being accessed is in sector 2, sector decoder 206 sends a sector enable signal to select sector 2 logic (select 2), which enables the word line decoder 208 and bit line decoder 230 to access a particular byte in sector 2. Similarly, if sector decoder 206 determines that addresses A15, A16, A17 and A18 are accessing a byte in sector 3, sector decoder 206 sends a sector enable signal to select sector 3 logic (select 3) which enables word line decoder 208 and bit line decoder 232 to access a byte in sector 3.

Similarly, sector 4 and sector 5 share sector decoder 210 and word line decoder 212. Sector decoder 210 receives address bits A15, A16, A17 and A18, and sends sector enable signals to select sector 4 logic (select 4) and select sector 5 logic (select 5) to enable sectors 4 and 5 to be accessed. Sector 6 and sector 7 share sector decoder 214 and word line decoder 216. Sector decoder 214 receives address bits A15, A16, A17 and A18, and sends sector enable signals to select sector 6 logic (select 6) and select sector 7 logic (select 7) to enable sectors 6 and 7 to be accessed. Sector 8 and sector 9 share sector decoder 218 and word line decoder 220. Sector decoder 218 receives address bits A15, A16, A17 and A18, and sends sector enable signals to select sector 8 logic (select 8) and select sector 9 logic (select 9) to enable sectors 8 and 9 to be accessed. Sector 10 and sector 11 share sector decoder 222 and word line decoder 224. Sector decoder 222 receives address bits A15, A16, A17 and A18, and sends sector enable signals to select sector 10 logic (select 10) and select sector 11 logic (select 11) to enable sectors 10 and 11 to be accessed. Sector 12 and sector 13 share sector decoder 226 and word line decoder 228. Sector decoder 226 receives address bits A15, A16, A17 and A18, and sends sector enable signals to select sector 12 logic (select 12) and select sector 13 logic (select 13) to enable sectors 12 and 13 to be accessed.

Bank 1 includes two sectors, sector 14 and sector 15, both of which include 64K bytes. Sector 14 and sector 15 share sector decoder 230 and word line decoder 232. Sector decoder 230 receives address bits A15, A16, A17 and A18, and sends sector enable signals to select sector 14 logic (select 14) and select sector 15 logic (select 15) to enable sectors 14 and 15 to be accessed. Bit line decoder 234 is used to address sector 14 and bit line decoder 236 is used to address sector 15. Various embodiments may include other suitable arrangements for Bank 0 and Bank 1, including a different number of sectors, different number of bytes per sector, etc. Additionally, data can be accessed by byte, word or other suitable quantity.

Figure 3A:
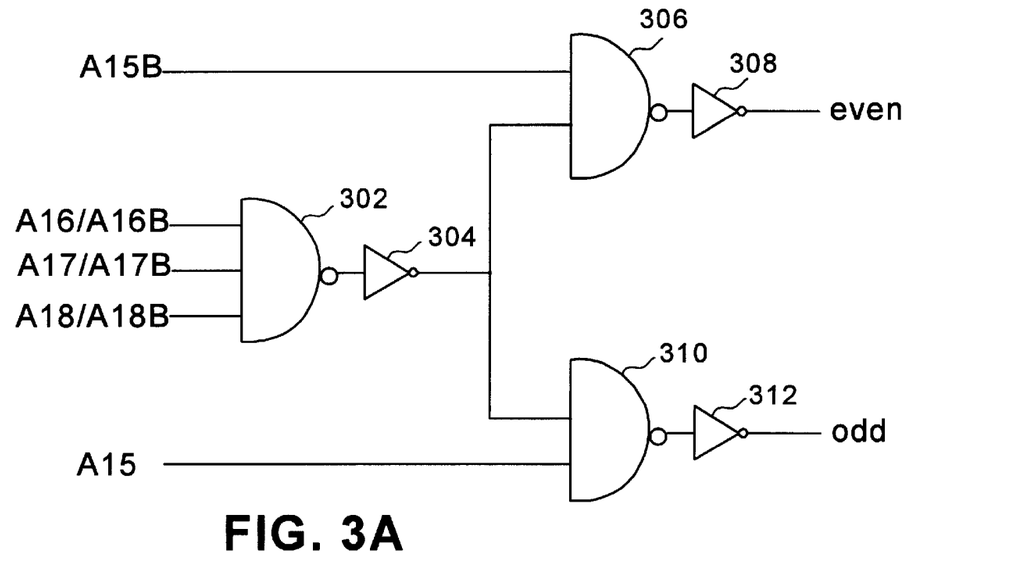
FIGS. 3A and 3B are schematics of the decoder logic for the sector decoder of FIG. 1.

As discussed above, each of the sector decoders (202, 206, 210, 214, 218, 222, 226 and 230) are used to send a sector enable signal to a respective sector. FIG. 3 is a schematic of a generic sector decode circuit. NAND gate 302 has three inputs. The first input could either be address bit A16 or its complement A16B (e.g. if A16=0, then A16B=1, A16B can be derived using an inverter). The second input to NAND gate 302 can be either address bit A17 or its complement A17B. The third input to NAND gate 302 can either be address bit A18 or its complement A18B. The output of NAND gate 302 is sent to inverter 304. The output of inverter 304 is the input to NAND gate 306 and NAND gate 310. An additional input to NAND gate 306 is A15B. The output of NAND gate 306 is an input to inverter 308. The output of inverter 308 is the sector enable signal for the even sector of the pair of sectors associated with the particular sector decoder. The other input to NAND gate 310 is address bit A15. The output of NAND gate 310 is the input to inverter 312. The output of inverter 312 is the sector enable signal for the odd sector of the pair of sectors associated with the particular sector decoder. Table 1 below illustrates the addressing of the sectors. For example, a byte found in sector 0, would have address bits A15, A16, A17 and A18 all being equal to zero.

TABLE 1

| Sector | A18 | A17 | A16 | A15 |
|--------|-----|-----|-----|-----|
| 0      | 0   | 0   | 0   | 0   |
| 1      | 0   | 0   | 0   | 1   |
| 2      | 0   | 0   | 1   | 0   |
| 3      | 0   | 0   | 1   | 1   |
| 4      | 0   | 1   | 0   | 0   |
| 5      | 0   | 1   | 0   | 1   |
| 6      | 0   | 1   | 1   | 0   |
| 7      | 0   | 1   | 1   | 1   |
| 8      | 1   | 0   | 0   | 0   |
| 9      | 1   | 0   | 0   | 1   |
| 10     | 1   | 0   | 1   | 0   |
| 11     | 1   | 0   | 1   | 1   |
| 12     | 1   | 1   | 0   | 0   |
| 13     | 1   | 1   | 0   | 1   |
| 14     | 1   | 1   | 1   | 0   |
| 15     | 1   | 1   | 1   | 1   |

Figure 3B:
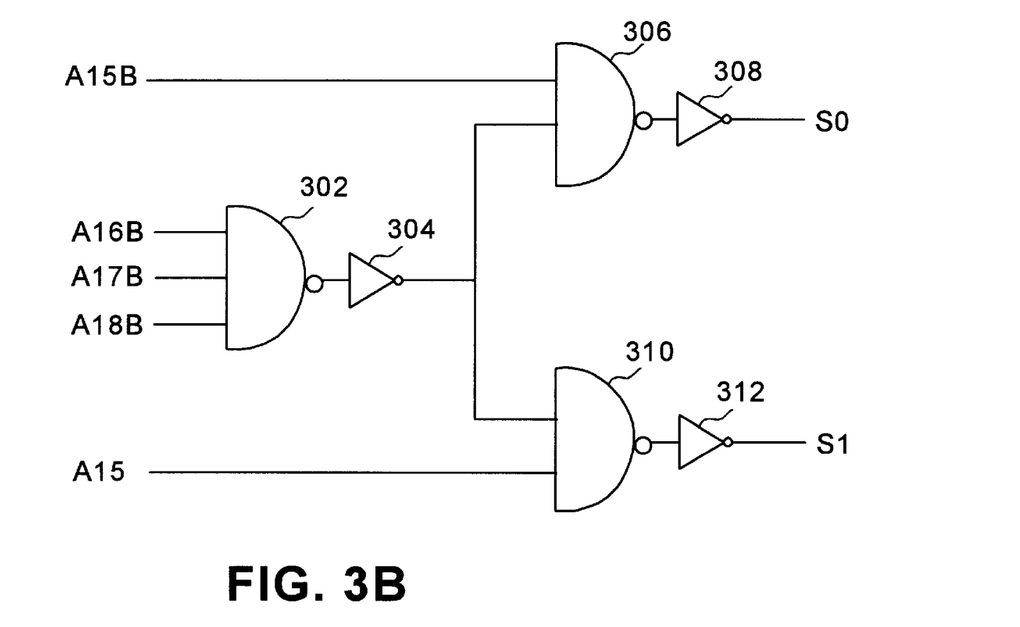

As can be seen from FIG. 3A, each of the inputs to NAND gate 302 have two possibilities. The specific inputs are chosen based on the particular sectors for which the decode circuit is associated with. For example, FIG. 3B shows sector decoder circuit 202, which is associated with sector 0 and sector 1. Sector decoder circuit 202 uses A16B, A17B and A18B as the inputs to NAND gate 302. If address A[18:15] equals [0,0,0,0], then the signal S0, which is the output of inverter 308, will be asserted. If address A[18:15] equals [0,0,0,1] then signal S1 is asserted (the output of inverter 312). Each of the decoders 206, 210, 214, 218, 222, 226 and 230 have the same structure as FIGS. 3A and 3B, the difference being the input to NAND gate 302 for each decoder. Table 2 shows the input to NAND gate 302 for each of the sector decoders.

TABLE 2

| Decoder | Sectors | Decoder Input |
|---------|---------|---------------|
| 202     | 0, 1    | A18B, A17B, A16B |
| 206     | 2, 3    | A18B, A17B, A16 |
| 210     | 4, 5    | A18B, A17, A16B |
| 214     | 6, 7    | A18B, A17, A16 |
| 218     | 8, 9    | A18, A17B, A16B |
| 222     | 10, 11  | A18, A17B, A16 |
| 226     | 12, 13  | A18, A17, A16B |
| 230     | 14, 15  | A18, A17, A16 |

Figure 4:
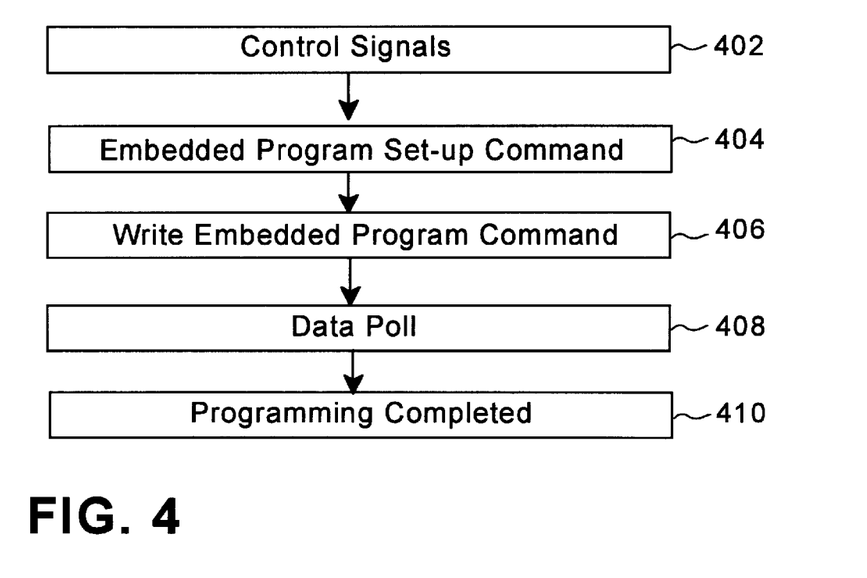
FIG. 4 is a flow chart describing how to program the memory device of FIG. 1.

FIG. 4 illustrates the steps performed by a user of memory device 100 to program a byte in either Bank 0 or Bank 1. First, the user must assert any necessary control inputs (step 402). That is, the user must use the control inputs to put the memory device 100 into program mode. By the term user, it is meant a processor or other component seeking access to memory. The user then inputs the embedded program set-up command (step 404) followed by the user inputting the embedded program command (step 406). Alternative embodiments include combining steps 402, 404 and 406 into one command. The embedded program set-up command stages the device for automatic programming of the addressed bytes. After step 406, state machine and control logic 122 perform the embedded program sequence. While the embedded program sequence is being performed, the user can poll memory device 100 for status (step 408). After the embedded program sequence is over, the program operation is complete (step 410). Memory 100 can be programmed by byte or word.

Figure 5:
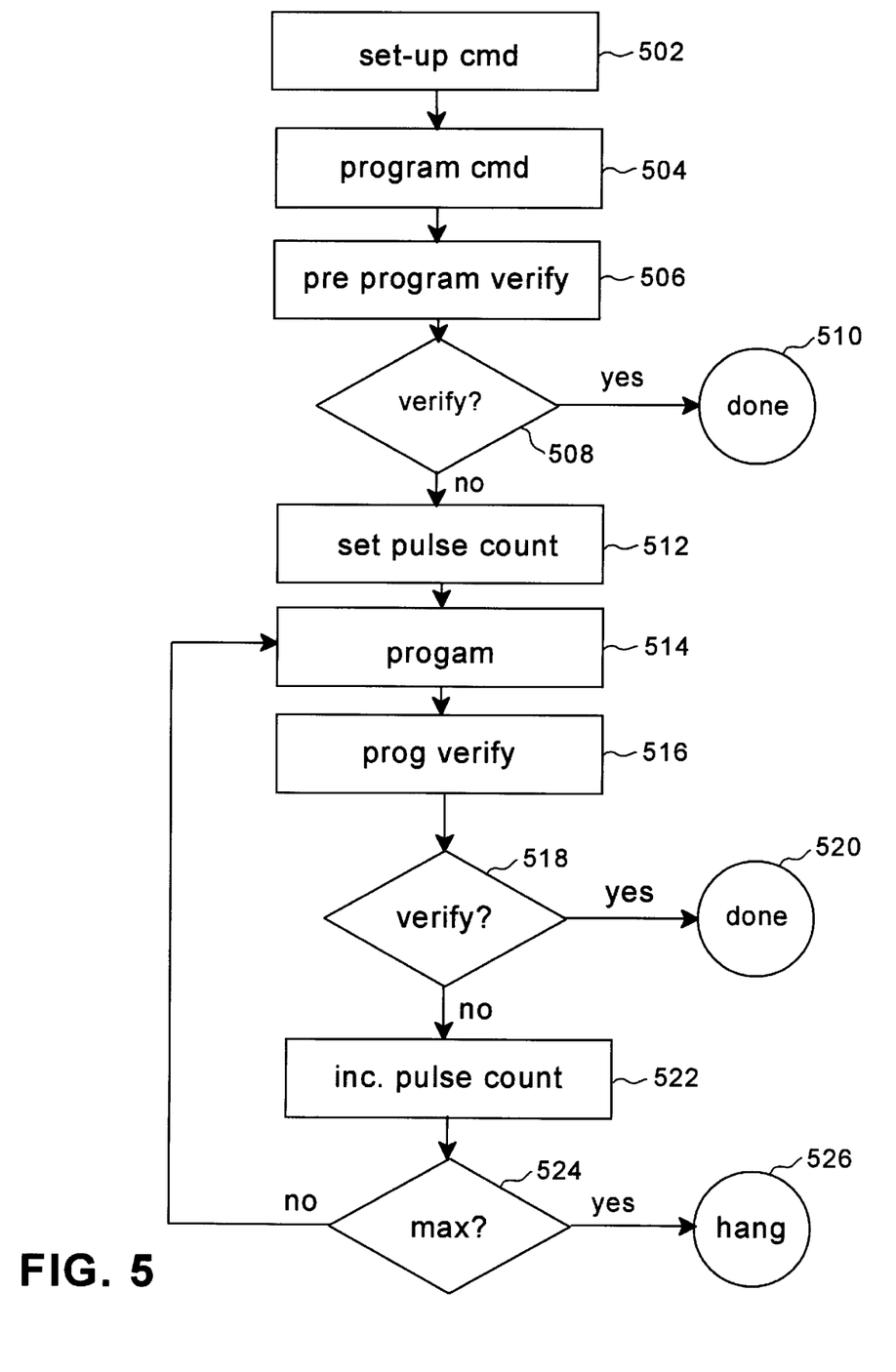
FIG. 5 is a flow chart which explains how the state machine in FIG. 1 performs the programming sequence.

FIG. 5 is a flow chart of the embedded program sequence controlled by state machine and control logic 122. When the user writes the set-up command in step 404, the state machine receives the set-up commands in step 502. When the user writes the program command in step 406, the state machine receives the program command in step 504. At that point, the user writes the address of the byte to be programmed on the address input 102. Subsequently, memory device 100, under the control of state machine and control logic 122, performs a preprogram verify in step 506. That is, prior to programming a byte, the device determines whether the bits in the byte are already programmed. If the necessary bits have already been programmed (step 508), then there is no need to perform the rest of the programing steps and the programming is complete (step 510).

If all of the necessary bit have not already been programmed, then the pulse counter is initialized in step 512. In step 514, a programming pulse is applied to the necessary bits and those bits are programmed. In step 516 the programmed byte is verified. That is, it is determined whether the programming was successful. In step 516, the device reads the byte from the respective bank and sends it to sense amplifier 176. In step 518, state machine and control logic 122 determines whether the program was successful. If the program was successful, then the program sequence is completed (step 520). If the programming was not successful, the pulse counter is incremented (step 522). The pulse counter is internal to the state machine logic. After the pulse counter is incremented, it is determined whether the pulse counter is at the maximum allowed value (step 524). One exemplar maximum allowed value is 250 pulses. If the maximum value has been reached, then the program sequence has failed and the memory device 100 hangs (step 526). If the pulse counter has not reached the maximum value, then the programming step (step 514) is performed again with the additional pulse. The flow continues to steps 516 and 518 as described above.

During the program operation, the state machine uses address bits A[15:18] to determine which sector the programmed byte is within. By knowing which sector the byte is in, the state machine knows which bank the byte is in. With knowledge of the correct bank, the state machine causes either B0_SEL or B1_SEL (see FIG. 1) to select the address from buffer 104. During the verify steps, state machine and control logic 122 causes VSA_SEL to select the output from the proper bank in order to send the data to verify sense amplifier 176. State machine and control logic 122 also sends the correct control signals to multiplexers 130, 138, 140, 144. If the byte being programmed is in Bank 0, the user is unable to read Bank 0. A user can continually data poll (step 408) until the programming sequence is complete. At that point a user can then read from Bank 0. However, while the program sequence is being performed for Bank 0, a user can read from Bank 1. Similarly, while a byte is being programmed in Bank 1, a user can read from Bank 0.

Figure 6:
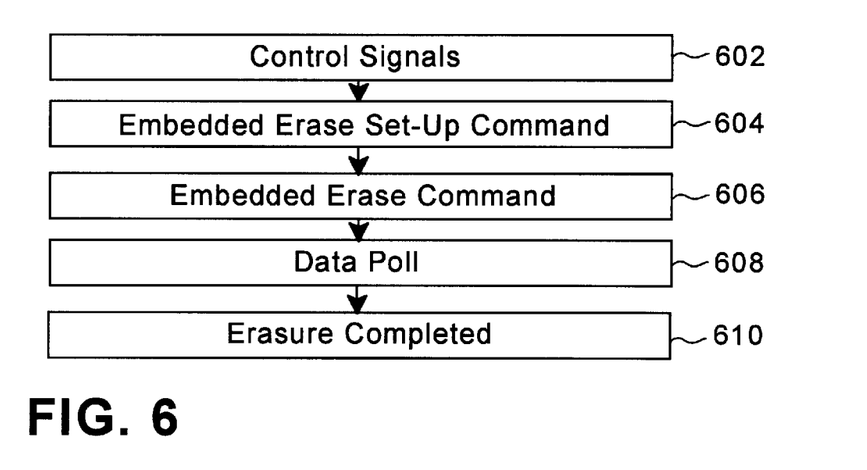
FIG. 6 is a flow chart which explains how to erase the memory device of FIG. 1.

FIG. 6 illustrates the steps performed by a user to erase a sector of memory device 100. The first step 602 is to apply the proper control inputs. A user must then send the embedded erase set-up command (step 604) followed by the embedded erase command (step 606). In one alternative, step 602, 604 and 606 can be combined into one step. After step 606, the embedded erase sequence commences, under control of state machine and control logic 122. While the embedded erase sequence is proceeding, a user can poll for status (step 608). In one embodiment, one of the data bits will be designated as a status bit. This status bit will be logic 0 until the erase operation is completed. Upon completion of the erase operation, the data on that status bit will be logic 1 for a defined period of time. After the embedded erase sequence is finished, erasure is completed (step 610).

Figure 7A:
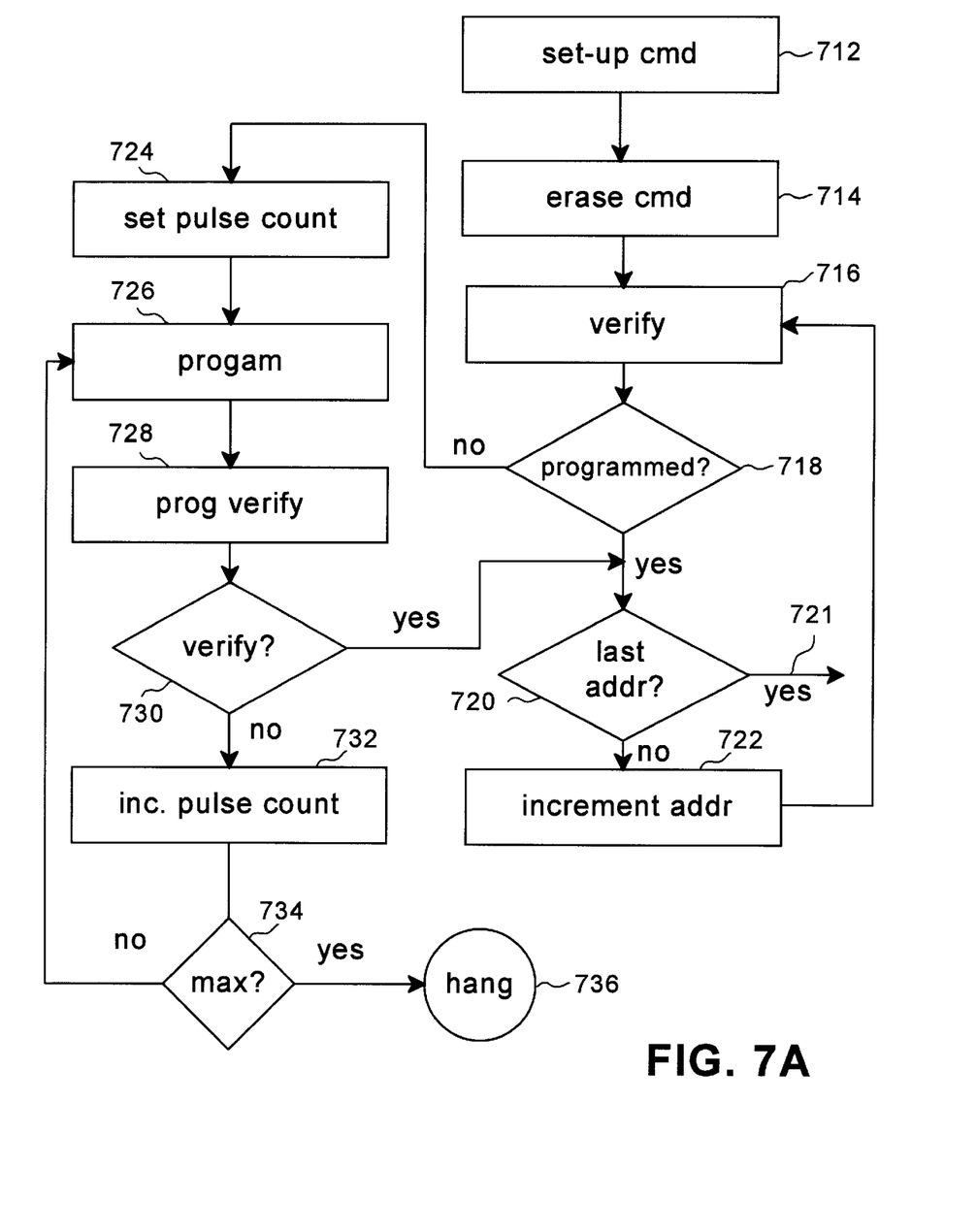
FIGS. 7A and 7B are flow charts which explain how the state machine in FIG. 1 performs the erase sequence.
Figure 7B:
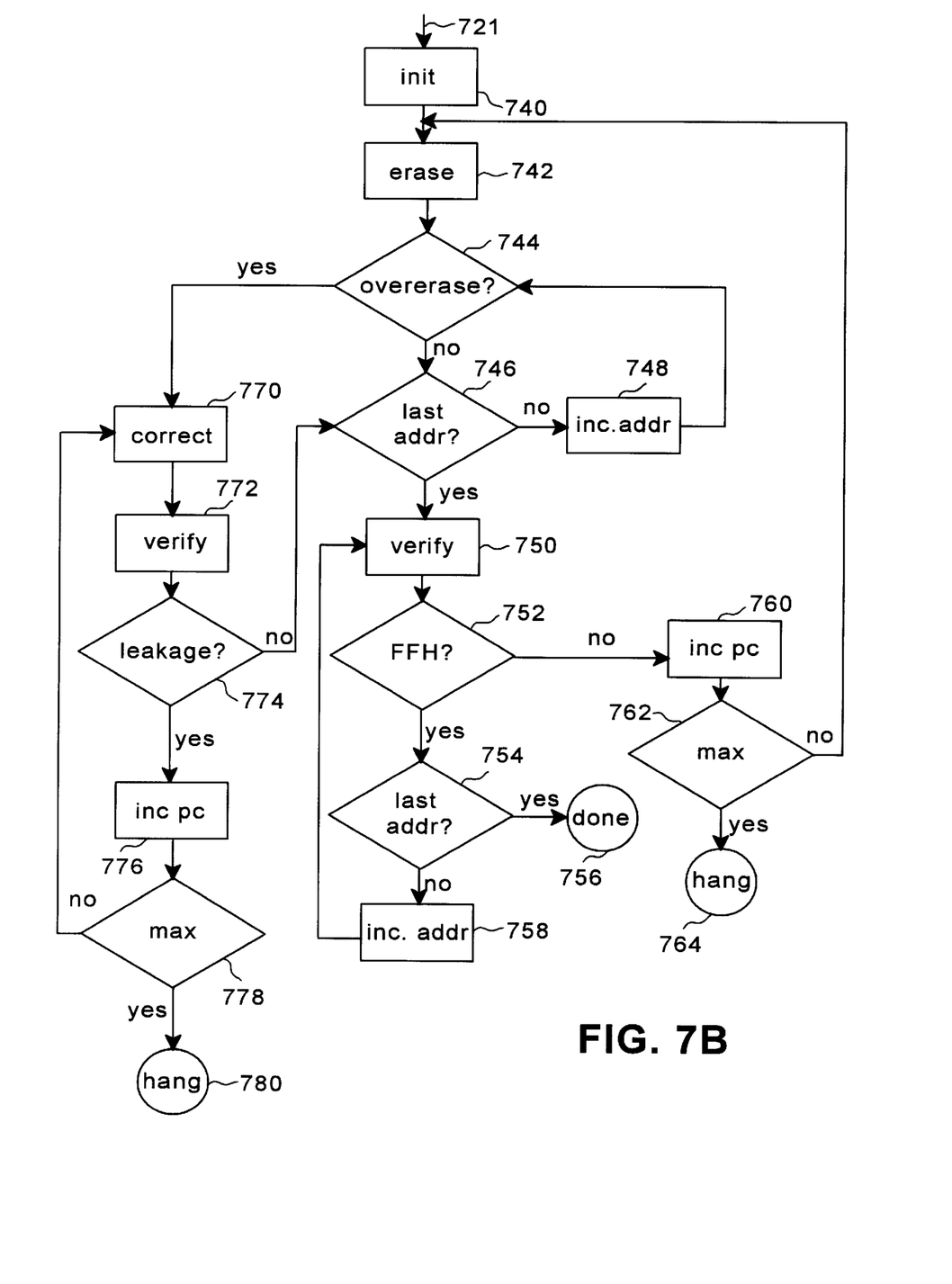

FIG. 7A and 7B illustrate the flow of the embedded erase sequence which is controlled by state machine and control logic 122. When a user writes the embedded erase set-up command in step 604 of FIG. 6, the state machine receives that set-up command in step 712. When the user writes the embedded erase command in step 606, the state machine receives the erase command in step 714. At that point, the user then writes the address of the sector to be erased on address input 102. In one embodiment, memory device 100 will allow a user to erase more than one sector at a time. In that case, the user will have to write more than one address.

Before memory device 100 erases any sectors, all bits in the sector must be programmed. Steps 716 through 734 are part of the process of programming all bytes prior to erase. In step 716, state machine and control logic 122 verifies whether the first byte in the addressed sector has been programmed. That is, the address of the first byte is sent, via the address sequencer 110, to the decoders and the addressed data is sent to verify sense amplifier 172. In step 718, state machine and control logic 122 determines whether the byte is completely programmed (e.g. the data in the byte is 00H). If the data for that byte is completely programmed then the device determines whether that byte was the last address in the sector (step 720). If so, then the sector is completely programmed and the device is ready to begin erasure. Arrow 721 connects the flow chart of FIG. 7A to the flow chart of FIG. 7B. Thus, when the last address is reached in step 720 the flow follows arrow 721 and moves on to the steps described in FIG. 7B. If the last address was not reached, address sequencer 110 is incremented (722) and steps 716 and 718 are repeated.

If in step 718 state machine and control logic 122 determines that the byte is not programmed, then the byte is programmed in the following steps. In step 724 the pulse counter is set. In step 726 the byte is programmed and in step 728 state machine and control logic 122 attempts to verify whether the byte has been programmed properly. If the byte has been programmed properly (step 730) then the device loops to step 720 to determine whether the byte is the last byte in the sector. If the byte was not programmed properly (step 730) then the pulse counter is incremented (step 732). If the pulse counter is at its maximum value (step 734) then memory device 100 will hang. If the pulse counter is not at its maximum value, the sequence will loop back to step 726 and there will be another attempt to program the byte. After all the bytes in the addressed sector has been programmed, the sector will be erased.

In step 740 (FIG. 7B), address sequencer 110 is initialized back to the first address of the sector and the pulse counter is reset. In step 742, the addressed sector is bulk erased using common methods known in the art for flash memories. In step 744, the device determines whether the first byte in the sector has been over erased. If it has not, then in step 746 the device determines whether the byte being considered for overerasure is the last byte in the sector. If it was not the last byte in the sector, then the address sequencer 110 is incremented and the next byte is checked for overerase. If any byte is determined to be overerased, then, in step 770, corrections are made to compensate for the overerase. These corrections can be one of many standard techniques known in the art for dealing with overerased flash memory cells. Prior to step 770, the pulse counter is reset. In step 772 the system verifies whether the overerased cell has been properly fixed. If there is no leakage current (step 774), then the sequence loops back to step 746 and determines whether this is the last byte in the sector. Additionally, the pulse counter is set back to the value it had prior to step 770. If there is still more leakage current, then the pulse counter is incremented in step 776. In step 778 the system determines whether the pulse counter is at its maximum value. If it is, the system hangs (step 780). If the pulse counter is not at its maximum value, the system loops back to step 770 in order to perform the overerase correction again.

After it is determined that all the bytes had not been overerased, the system performs a byte by byte erase verify. If a particular byte is FFH then the erase for that particular byte was successful (step 750). After determining that the byte was successfully erased, the state machine determines whether the byte just considered is the last byte in the sector (step 754). If it is the last byte, then erasure is completed (step 756). If it is not the last byte, then address sequencer 110 is incremented (step 758) and the sequence loops back to step 750 in order to verify the next byte. If, in step 752, it is determined that the data was not FFH (e.g. erasure was not successful) then the pulse counter is incremented in step 760. If the pulse counter was incremented to its maximum value (step 762) then the system hangs (step 764). If the pulse counter was not incremented to its maximum value, then the system loops back to step 742.

While the system is performing the erase verification, the addresses used to access the flash memory cells is being generated by address sequencer 110. Therefore, state machine and control logic 122 uses either B0_SEL or B1_SEL to cause multiplexers 106 or 108 to select the address from address sequencer 110.

The embedded erase sequence described above describes erasing a sector. Alternatives include erasing multiple sectors or an entire bank of sectors. In each alternative, the method of FIGS. 6 and 7 would be appropriately altered. For example, the pre-erase verification would need to be carried out for each sector and the bulk erase would include verifying each sector.

Figure 8:
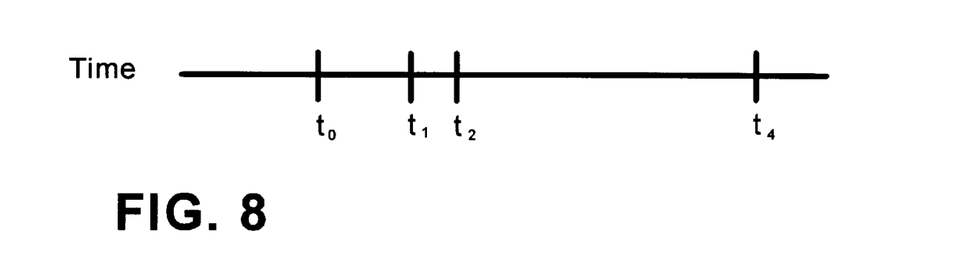
FIG. 8 is a time line which explains the simultaneous read/write capability of the present invention.

FIG. 8 is a time line to illustrate the advantages of the present invention. For example purposes assume that a user is performing an erase sequence for sector 1. Thus, Bank 0 would begin the embedded erase sequence at time $t_0$. The erase sequence will be completed at time $t_4$. In the period from $t_0$ to $t_4$, Bank 0 is unavailable for a read operation. However, Bank 1 is available for a read operation. A user can request a read from Bank 1 at $t_1$ and receive the data from that read at time $t_2$. Thus, while one bank is performing in an embedded operation, the other bank can be accessed for a read operation.

The embodiment described with respect to FIG. 1 includes two banks. The present invention, however, is scalable. That is, the present invention can include three or more banks. Each bank would have its own address multiplexer and would be able to communicate read data to a read sense amplifier or a verify sense amplifier.

The foregoing detailed description of the invention has been presented for purposes of illustration and description. It is not intended to be exhaustive or to limit the invention to the precise form disclosed, and obviously many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We Claim:

1. A flash memory device, comprising:
   at least two banks of flash memory cells; and
   means for simultaneously reading from one of said banks while writing to another of said banks;
   wherein:
   said means for simultaneously reading includes a state machine for performing an embedded method for erasing and programming, said means reads from one bank while said state machine erases another bank;
   said flash memory device includes an address input; and
   said means for simultaneously reading includes:
      control logic generating a control address,
      first decode logic receiving said address input and said control address, said first decode logic selectively using said address input or said control address to access a first bank of said at least two banks; and
      second decode logic receiving said address input and said control address, said second decode logic selectively using said address input or said control address to access said second bank of said at least two banks, said second decode logic being different from said first decode logic;
   said flash memory device further includes:
      a first sense amplifier circuit receiving read data from said first bank and read data from said second bank, said first sense amplifier circuit selectively using said read data from said first bank and read data from said second bank to generate a read data output; and
      a second sense amplifier circuit receiving read data from said first bank and read data from said second bank, said second sense amplifier circuit selectively using said read data from said first bank and read data from said second bank to generate verify data, said verify data being sent to said write control logic.

2. The flash memory device according to claim 1, further comprising:
   a multistate power supply that provides power based on an operation being performed on at least one of said at least two banks of flash memory cells.

3. The flash memory device according to claim 1, further comprising:
   an address buffer configured to store an address to be read from one of said at least two banks of flash memory cells; and
   an address sequencer configured to sequence a set of addresses to be at least one of programmed and verified in a second of said at least two banks of flash memory cells.

4. A non-volatile memory device capable of simultaneous reading and writing, comprising:
   a first set of memory cells;
   a second set of memory cells; and
   address logic having outputs including a first set of decoded lines and a second set of decoded lines, said address logic selectively using either a first address or a second address to access said first set of memory cells with said first set of decoded lines and selectively using either said first address or said second address to access said second set of memory cells with said second set of decoded lines;
   wherein:
   said first set of memory cells are flash memory cells;
   said second set of memory cells are flash memory cells;
   said flash memory device receives address and control information, said address input receiving said first address;
   said flash memory device further includes control logic receiving said control information, said control logic generating said second address and said control logic being in communication with said address logic;
   a first sense amplifier circuit receiving read data from said first set of flash memory cells and read data from said second set of flash memory cells, said first sense amplifier circuit selectively using said read data from said first set of flash memory cells and read data from said second set of flash memory cells to generate a read data output; and
   a second sense amplifier circuit receiving read data from said first set of flash memory cells and read data from said second set of flash memory cells, said second sense amplifier circuit selectively using said read data from said first set of flash memory cells and read data from said second set of flash memory cells to generate verify data, said verify data being sent to said control logic.

5. A non-volatile memory device according to claim 4, wherein:
   said first set of flash memory cells includes fourteen sectors of flash memory cells; and
   said second set of flash memory cells includes two sectors of flash memory cells.

6. A flash memory device according to claim 4, wherein:
   said second address being used as a program address.

7. A flash memory device according to claim 4, wherein:
   said second address being used as an erase address.

8. A flash memory device according to claim 4, wherein:
   said first set of flash memory cells being capable of performing a read while said second set of flash memory cells is performing a write; and said second set of flash memory cells being capable of performing a read while said first set of flash memory cells is performing a write.

9. A flash memory device according to claim 4, wherein:
said flash memory device includes an address input and control logic, said address input receives said first address, said control logic generates said second address and
said address logic includes:
  first decode logic receiving said first address and said second address, said first decode logic selectively using said address input or said write address to access said first set of flash memory cells with said first set of decoded lines; and
  second decode logic receiving said first address and said second address, said second decode logic selectively using said first address or said second address to access said second set of flash memory cells with said second set of decoded lines, said second decode logic being different from said first decode logic.

10. A flash memory according to claim 9, wherein:
said first decode logic includes a multiplexer and a decoder, said multiplexer receives said first address and said second address, said decoder is in communication with said multiplexer and said first set of flash memory cells.

11. A flash member device according to claim 9, wherein:
said control logic includes a state machine.

12. A flash memory device according to claim 4, wherein:
said flash memory device includes an address input and a control input;
said flash memory device further including control logic generating said second address, said control logic receiving said control input; and
said address logic includes:
  a first multiplexer receiving said first address and said second address, said first multiplexer selecting either said first address or said second address based on a first signal from said control logic;
  a first word line decoder receiving a first subset of an output of said first multiplexer,
  a first bit line decoder receiving a second subset of said output of said first multiplexer,
  a second multiplexer receiving said first address and said second address, said second multiplexer selecting either said first address or said second address based on a second signal from said control logic;
  a second word line decoder receiving a first subset of an output of said second multiplexer, and
  a second bit line decoder receiving a second subset of said output of said second multiplexer.

13. A flash memory device according to claim 12, wherein:
said address logic further includes a first sector decoder and a second sector decoder, said first sector decoder receiving a third subset of said output of said first multiplexer, said second sector decoder receiving a third subset of said output of said second multiplexer.

14. A flash memory device according to claim 12, further including:
  a third multiplexer capable of receiving read data from said first set of flash memory cells and read data from said second set of flash memory cells, said third multiplexer selecting either said read data from said first set of flash memory cells or said read data from said second set of flash memory cells based on a third control signal received from said control logic;
  a read sense amplifier receiving an output of said third multiplexer;
  a fourth multiplexer capable of receiving said read data from said first set of flash memory cells and said read data from said second set of flash memory cells, said fourth multiplexer selecting either said read data from said first set of flash memory cells or said read data from said second set of flash memory cells based on a fourth control signal received from said control logic; and
  a verify sense amplifier receiving an output of said fourth multiplexer.

15. A flash memory device according to claim 12, further including:
  a first sense amplifier circuit capable of receiving read data from said first set of flash memory cells and read data from said second set of flash memory cells, said first sense amplifier circuit selectively using said read data from said first set of flash memory cells and read data from said second set of flash memory cells to generate a read data output; and
  a second sense amplifier circuit capable of receiving said read data from said first set of flash memory cells and said read data from said second set of flash memory cells, said second sense amplifier circuit selectively using said read data from said first set of flash memory cells or read data from said second set of flash memory cells to generate verify data.

16. The non-volatile memory device according to claim 4, further comprising:
  a multistate power supply that provides power based on an operation being performed on at least one of said first and second sets of memory cells.

17. The non-volatile memory device according to claim 4, further comprising:
  an address buffer configured to store an address to be read from one of said first and second sets of flash memory cells; and
  an address sequencer configured to sequence a set of addresses to be at least one of programmed and verified in another of said first and second sets of flash memory cells.

18. A semiconductor non-volatile memory device, comprising:
  a first bank of sectors;
  a second bank of sectors, each sector of said first bank and said second bank including non-volatile memory cells;
  first address decode logic, said first address decode logic accessing said first bank; and
  second address decode logic, said second address decode logic accessing said second bank;
wherein:
said memory device receives an address input;
said memory device further including a state machine for performing an embedded
method for erasing and programming, said state machine generating a control address;
said first bank being capable of using a first address from said address input to perform a read while said second bank is using said control address to perform a write;
said second bank being capable of using said first address to perform a read while said first bank is using said control address to perform a write; and
said semiconductor non-volatile memory device further comprising, a first sense amplifier circuit receiving read data from said first bank and read data from said second bank, said first sense amplifier circuit selectively using said read data from said first bank and read data from said second bank to generate a read data output, and a second sense amplifier circuit receiving read data from said first bank and read data from said second bank, said second sense amplifier circuit selectively using said read data from said first bank and read data from said second bank to generate verify data.

19. The semiconductor non-volatile memory device according to claim 18, further comprising:

a multistate power supply that provides power based on an operation being performed on at least one of said first and second banks of sectors.

20. The semiconductor non-volatile memory device according to claim 18, further comprising:

an address buffer configured to store an address to be read from one of said first and second banks of sectors; and an address sequencer configured to sequence a set of addresses to be at least one of programmed and verified in another of said first and second banks of sectors.

21. A method of enabling simultaneous read and write operations in a flash memory, comprising the steps of:

arranging a set of flash memory cells as a plurality of sectors, each sector containing a plurality of said flash memory cells;

arranging said sectors into two banks of sectors;

providing independent address decode circuits to each of said banks;

providing a control circuit for writing to said banks, said control circuitry generating a control address;

providing a selection circuit selectively coupling said address decode logic to said control address or an external address;

providing a first sense amplification circuit for reading data from said banks;

providing a second sense amplification circuit for reading data from said banks, said second sense amplification circuit communicating with said control circuit to verify writes to said banks.

22. The method according to claim 21, further comprising the step of:

providing a multistate power supply that provides power based on an operation being performed on at least one of said banks.

23. The method according to claim 21, further comprising the steps of:

loading addresses into a buffer, said addresses for reading from one of said banks of sectors; and sequencing an address sequencer through a set of addresses to be at least one of programmed or verified in another of said banks of sectors.

24. A method for simultaneously reading and writing in a flash memory, comprising the steps of:

sending a first address to a first decoder, said first decoder associated with a first set of flash memory cells;

writing to said first set of memory cells;

sending a second address to a second decoder, said second decoder associated with a second set of flash memory cells;

reading data from said second set of flash memory cells after said step of writing has started and before said step of writing has finished;

writing to said second set of memory cells; and reading data from said first set of memory cells after said step of writing to said second set of memory cells has started and before said step of writing to said second set of memory cells has finished;

wherein said step of writing includes an embedded programming sequence that utilizes a verify sense amplifier that sends data to a state machine to verify said programming sequence;

said step of writing includes programming a cell of said first set of memory cells and verifying said programmed cell; and said step of reading is capable of sensing an addressed cell simultaneously with said step of verifying said programmed cell.

25. A method according to claim 24, wherein said step of writing includes an embedded erasing sequence.

26. The method according to claim 24, further comprising the step of:

providing a multistate power supply that provides power based on an operation being performed on at least one of said first and second sets of flash memory cells.

27. A method for simultaneously reading and writing in a semiconductor non-volatile memory device, said memory device including a first set of memory cells and a second set of memory cells, comprising the steps of:

writing to either said first set of memory cells or said second set of memory cells, said step of writing includes sending a first address to a first decoder if said step of writing includes writing to said first set and sending a second address to a second decoder if said step of writing includes writing to said second set of memory cells;

reading data from said second set of memory cells after said step of writing has started and before said step of writing has finished, if said step of writing includes writing to said first set of memory cells; and reading data from said first set of memory cells after said step of writing has started and before said step of writing has finished, if said step of writing includes writing to said second set of memory cells;

wherein:

said first set of memory cells is a first bank of sectors of flash memory cells;

said second set of memory cells is a second bank of flash memory cells;

said step of writing includes programming a cell and verifying said programmed cell; and said steps of reading data are capable of sensing an addressed cell simultaneously with said step of verifying said programmed cell.

28. The method according to claim 27, further comprising the step of:

providing a multistate power supply that provides power based on an operation being performed on at least one of said first and second sets of memory cells.

* * * * *

UNITED STATES PATENT AND TRADEMARK OFFICE
CERTIFICATE OF CORRECTION

PATENT NO. : 5,867,430
DATED : February 2, 1999
INVENTOR(S) : Chen, et al.

It is certified that error appears in the above-identified patent and that said Letters Patent is hereby corrected as shown below:

In the Claims:

Claim 11, Line 1: Change "member" to -- memory --

On the Cover Page, Item [73],

Assignees: Advanced Micro Devices, Inc.
Sunnyvale, Calif.

Fujitsu Limited
Kangawa-ken, Japan

Signed and Sealed this

Sixth Day of July, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT NO.  : 5,867,430
DATED       : February 2, 1999
INVENTOR(S) : Chen, et al.

It is certified that error appears in the above-indentified patent and that said Letters Patent is hereby corrected as shown below:

On the title page, item [73] Assignees should read

Advanced Micro Devices, Inc.
    Sunnyvale, Calif.

Fujitsu Limited
    Kangawa-Ken, Japan Signed and Sealed this Twenty-sixth Day of October, 1999

Attest:

Q. TODD DICKINSON

*Attesting Officer*    Acting Commissioner of Patents and Trademarks